(12) United States Patent
Inoue et al.

(10) Patent No.: US 11,588,162 B2
(45) Date of Patent: Feb. 21, 2023

(54) METHOD OF DETECTING DEGRADATION OF MEMBRANE ELECTRODE ASSEMBLY OF FUEL CELL

(71) Applicant: HONDA MOTOR CO., LTD., Tokyo (JP)

(72) Inventors: Kazuhide Inoue, Wako (JP); Kuniaki Ojima, Wako (JP); Tomoyuki Inoue, Wako (JP); Osamu Ogami, Wako (JP)

(73) Assignee: Honda Motor Co., Ltd., Tokyo (JP)

( * ) Notice: Subject to any disclaimer, the term of this patent is extended or adjusted under 35 U.S.C. 154(b) by 193 days.

(21) Appl. No.: 17/183,965

(22) Filed: Feb. 24, 2021

(65) Prior Publication Data

US 2021/0265646 A1 Aug. 26, 2021

(30) Foreign Application Priority Data

Feb. 26, 2020 (JP) .............................. JP2020-030120

(51) Int. Cl.
*H01M 8/04664* (2016.01)
*G01R 31/392* (2019.01)
*H01M 8/0438* (2016.01)
*H01M 8/1004* (2016.01)

(52) U.S. Cl.
CPC ...... *H01M 8/04664* (2013.01); *G01R 31/392* (2019.01); *H01M 8/04388* (2013.01); *H01M 8/1004* (2013.01)

(58) Field of Classification Search
None
See application file for complete search history.

(56) References Cited

U.S. PATENT DOCUMENTS

2010/0248060 A1* 9/2010 Bono ................ H01M 8/04753
429/443

FOREIGN PATENT DOCUMENTS

JP 2010-073497 A 4/2010

\* cited by examiner

*Primary Examiner* — Jas A Sanghera
(74) *Attorney, Agent, or Firm* — Carrier Shende & Associates, P.C.; Joseph P. Carrier; Fulchand P. Shende (57) ABSTRACT

A method of detecting degradation of a membrane electrode assembly of a fuel cell is provided. In the method, it is possible to detect degradation (cross leakage) of the fuel cell. In the measurement step, the pressure drop value of the pressure of the fuel gas which decreases in the power generation state after discharging of the predetermined amount of the fuel gas, in each predetermined period of time is measured a plurality of times. Thereafter, in the determination step, it is determined that the membrane electrode assembly has been degraded in the case where the minimum pressure drop value, among a plurality of pressure measurement values, exceeds a threshold value.

4 Claims, 5 Drawing Sheets

METHOD OF DETECTING DEGRADATION OF MEMBRANE ELECTRODE ASSEMBLY OF FUEL CELL

CROSS-REFERENCE TO RELATED APPLICATION

This application is based upon and claims the benefit of priority from Japanese Patent Application No. 2020-030120 filed on Feb. 26, 2020, the contents of which are incorporated herein by reference.

BACKGROUND OF THE INVENTION

Field of the Invention

The present invention relates to a method of detecting degradation of a membrane electrode assembly of a fuel cell which performs power generation by electrochemical reactions of a fuel gas supplied to an anode of the membrane electrode assembly and an oxygen-containing gas supplied to a cathode of the membrane electrode assembly.

Description of the Related Art

For example, a solid polymer electrolyte fuel cell includes a membrane electrode assembly (MEA) having an anode on one surface of an electrolyte membrane, and a cathode provided on the other surface of the electrolyte membrane. The electrolyte membrane is a polymer ion exchange membrane. The MEA is sandwiched between separators to form a power generation cell (unit cell). In general, a predetermined number of power generation cells are stacked together to form, e.g., an in-vehicle fuel cell stack mounted in a fuel cell vehicle (fuel cell electric automobile, etc.).

In the power generation cell, the fuel gas may be leaked to the cathode, or the oxygen-containing gas may be leaked to the anode due to degradation of the membrane of the membrane electrode assembly (e.g., pin holes, reduction in the thickness of the membrane). This phenomenon is referred to as the "cross leakage". If cross leakage occurs, the power generation performance is degraded.

For example, Japanese Laid-Open Patent Publication No. 2010-073497 (hereinafter referred to as JP2010-073497A) discloses a technique of detecting the cross leakage. In this technique, the voltage behavior in a target cell after stopping supply of at least one of reactant gases (a fuel gas and an oxygen-containing gas) is detected by voltage detection means. Then, based on the difference between the voltage behavior of a reference cell and the voltage behavior of the target cell after the stop of supplying the reactant gases, cross leakage of the target cell is detected by cross leakage detection means. In this manner, it is possible to detect cross leakage of each cell (paragraph [0008] of JP2010-073497A).

SUMMARY OF THE INVENTION

According to JP2010-073497A, in the above technique, it is possible to detect the cross leakage accurately.

However, in JP2010-073497A, in order to detect cross leakage, it is required to measure the voltage behavior of the target cell. Since the voltage behavior of each cell is measured, the number of positions where measurement is required is large, and the measurement is laborious. Therefore, it takes considerable time to detect the cross leakage of the cells of the fuel cell stack.

The present invention has been made taking such a problem, and an object of the present invention is to provide a method of detecting degradation of a membrane electrode assembly in a fuel cell in which it is possible to detect degradation (cross leakage) of the fuel cell easily, in a short period of time, and accurately.

According to one aspect of the present invention, a method of detecting degradation of a membrane electrode assembly of a fuel cell is provided. The fuel cell is configured to perform power generation using a fuel gas discharged through an injector and supplied from a fuel gas inlet to an anode of a membrane electrode assembly of a cell, a fuel exhaust gas from a fuel gas outlet mixed with the fuel gas, and supplied to the fuel gas inlet, and an oxygen-containing gas supplied from an oxygen-containing gas inlet to a cathode of the membrane electrode assembly, and the method includes discharging a predetermined amount of the fuel gas from the injector, measuring, a plurality of times, a pressure drop value of the pressure of the fuel gas which decreases after discharging of the fuel gas, in each predetermined period of time, by a pressure sensor provided downstream of the injector, between the fuel gas outlet and the fuel gas inlet, and determining that the membrane electrode assembly has been degraded in a case where the minimum pressure drop value, among a plurality of pressure measurement values, exceeds a threshold value.

In the present invention, a pressure drop value of the pressure of the fuel gas which decreases in the power generation state after discharging of the fuel gas in each predetermined period of time is measured a plurality of times. Thereafter, in the determination step, it is determined that the membrane electrode assembly has been degraded in the case where the minimum pressure drop value, among a plurality of pressure measurement values, exceeds a threshold value. In this manner, it is possible to detect degradation (cross leakage) of the fuel cell easily, in a short period of time, and accurately without providing any additional member for measurement.

The above and other objects, features and advantages of the present invention will become more apparent from the following description when taken in conjunction with the accompanying drawings in which preferred embodiments of the present invention are shown by way of illustrative example.

DESCRIPTION OF THE PREFERRED EMBODIMENTS

A preferred embodiment of a method of detecting degradation of a membrane electrode assembly of a fuel cell according to the present invention will be described in detail with reference to the accompanying drawings.

EMBODIMENT

[Structure]

Figure 1:
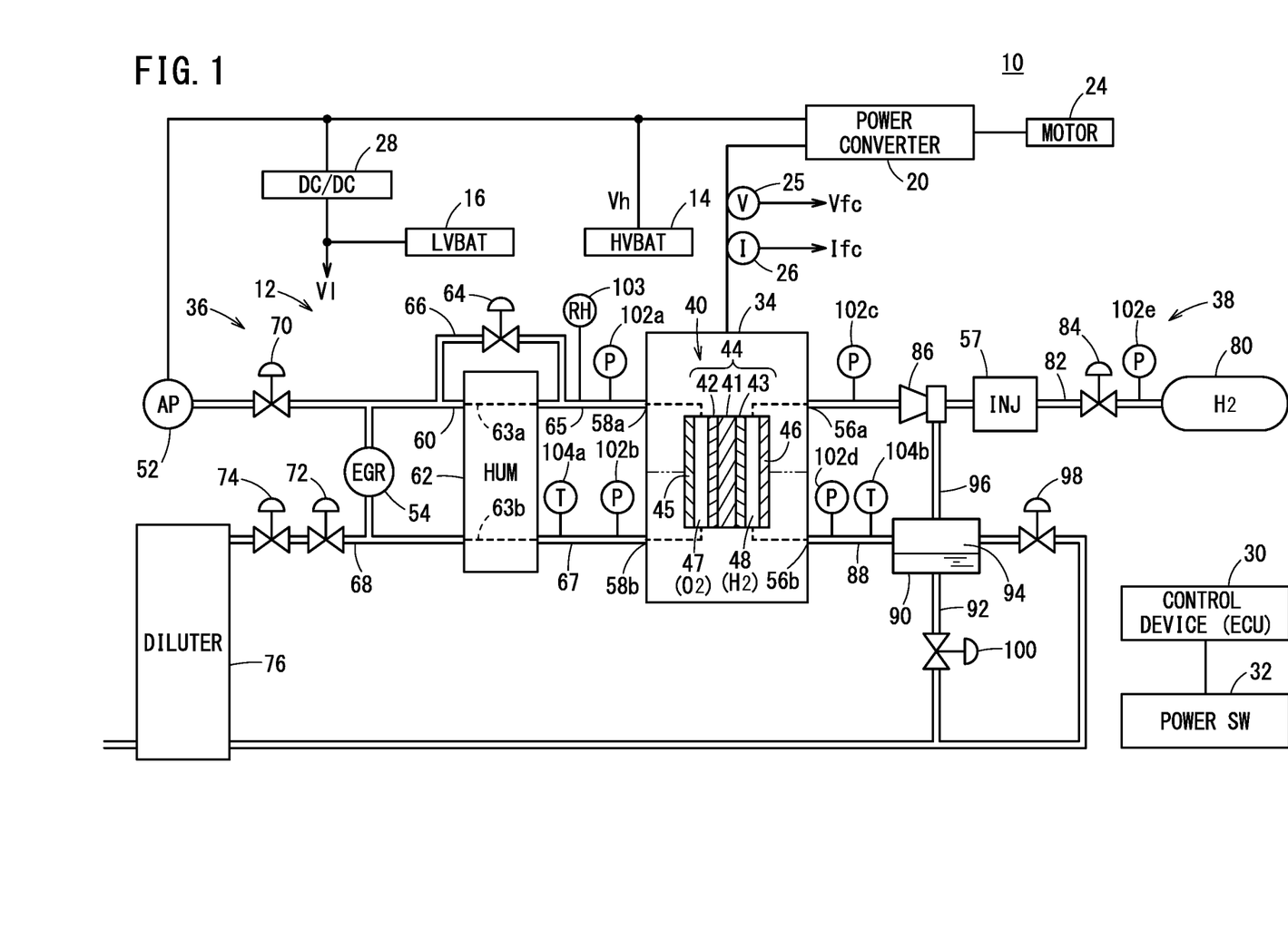
FIG. 1 is a block diagram showing an example of structure of a vehicle (fuel cell vehicle) equipped with a fuel cell system according to an embodiment in which a method of detecting degradation of a membrane electrode assembly in the fuel cell system is performed.

FIG. 1 is a block diagram schematically showing an example of structure of a vehicle (fuel cell vehicle) 10 equipped with a fuel cell system 12 according to an embodiment in which a method of detecting degradation of a membrane electrode assembly in the fuel cell system 12 is performed.

For example, as shown in FIG. 1, the fuel cell vehicle 10 is a fuel cell electric automobile.

The fuel cell vehicle 10 includes, in addition to the fuel cell system 12, a high voltage battery (HVBAT: high voltage storage device) 14 for generating high voltage Vh of several hundred volts, a low voltage battery (LVBAT: low voltage storage device) 16 for generating low voltage Vl of about several tens of volts which is lower than the voltage of the high voltage battery 14, e.g., +12[V], a power converter 20, a motor (rotary machine for driving the vehicle) 24, a step-down converter (DC/DC converter) 28, a control device (ECU) 30, and a power switch (power SW) 32.

The control device 30 is made up of an ECU (electronic control unit). In the ECU, a CPU executes a program stored in a memory to function as a various function control unit described later, and controls constituent elements of the fuel cell vehicle 10 including the fuel cell system 12 through a control line (including a wireless line).

Basically, the fuel cell system 12 includes a fuel cell stack (fuel cells) 34, an oxygen-containing gas supply apparatus 36, and a fuel gas supply apparatus 38.

The oxygen-containing gas supply apparatus 36 supplies the oxygen-containing gas to the fuel cell stack 34, and the fuel gas supply apparatus 38 supplies the fuel gas to the fuel cell stack 34.

The fuel cell stack 34 is formed by stacking a plurality of power generation cells 40. Each of the power generation cells 40 includes a membrane electrode assembly 44 and separators 45, 46 sandwiching the membrane electrode assembly 44.

The membrane electrode assembly 44 includes a solid polymer electrolyte membrane 41, and a cathode 42 and an anode 43 provided on both sides of the solid polymer electrolyte membrane 41. For example, the solid polymer electrolyte membrane 41 is a thin membrane of perfluorosulfonic acid containing water.

Each of the cathode 42 and the anode 43 includes a gas diffusion layer (not shown) of a carbon paper, etc. An electrode catalyst layer (not shown) is formed by depositing porous carbon particles uniformly on the surface of the gas diffusion layer, and platinum alloy is supported on surfaces of the carbon particles. The electrode catalyst layers are formed on both surfaces of the solid polymer electrolyte membrane 41.

One of separators 45, 46 (separator 45) has a cathode flow field (oxygen-containing gas flow field) 47 on its surface facing the membrane electrode assembly 44. The cathode flow field 47 is connected to an oxygen-containing gas inlet connection port (oxygen-containing gas inlet) 58a and an oxygen-containing gas outlet connection port (oxygen-containing gas outlet) 58b. That is, the fuel cell stack 34 includes the oxygen-containing gas inlet connection port 58a and the oxygen-containing gas outlet connection port 58b for supplying the oxygen-containing gas (e.g., the air) to the cathode 42 through the cathode flow field 47.

The other separator 46 has an anode flow field 48 on its surface facing the membrane electrode assembly 44. The anode flow field 48 is connected to a fuel gas inlet connection port (fuel gas inlet) 56a and a fuel gas outlet connection port (fuel gas outlet) 56b. That is, the fuel cell stack 34 includes a fuel gas inlet connection port 56a and a fuel gas outlet connection port 56b, for supplying a fuel gas (e.g., a hydrogen gas) to the anode 43 through the anode flow field 48.

It should be noted that the fuel cell stack 34 is provided with a coolant inlet connection port (not shown) and a coolant outlet connection port (not shown) for allowing a coolant to flow in each of the power generation cells 40.

The output of the stacked power generation cells 40, i.e., the output of the fuel cell stack 34 (power generation electrical energy of the power generation voltage Vfc at direct current high voltage) is converted into the electrical energy at high voltage through the power converter 20 under control of the control device 30, and thereafter, converted into the electrical energy of alternating current voltage and supplied to the motor 24. Further, electrical energy which is converted into direct current electrical energy at high voltage through the power converter 20 is charged in the high voltage battery 14.

Further, the output of the fuel cell stack 34 (power generation electrical energy of the power generation voltage Vfc) is charged in the low voltage battery 16 through the power converter 20 and the step-down converter 28.

At the time of the start-up time (at the time of starting operation) where the power switch 32 is switched from the OFF state to the ON state, or at the time of acceleration by controlling an accelerator pedal during travel of the fuel cell vehicle 10, the electrical energy of the high voltage battery 14 at high voltage Vh is capable of driving the motor 24 through the power converter 20.

In this manner, the motor 24 can be driven by electrical energy of the high voltage battery 14 and/or electrical energy (power running electrical energy) of the fuel cell stack 34. On the other hand, the regenerative electrical energy of the motor 24 generated at the time of deceleration is converted from the alternating current into the direct current through the power converter 20, and charged in the high voltage battery 14.

Further, the electrical energy of the high voltage battery 14 at high voltage Vh can drive an air pump (AP, air compressor) 52 and/or air conditioner (not shown).

The electrical energy of the low voltage battery 16 at low voltage Vl is supplied to an exhaust gas recirculation pump (EGR pump) 54, an injector 57, the control device 30, and various solenoid valves described later, and additionally, supplied to low voltage loads such as a lighting device (not shown), etc.

The oxygen-containing gas supply apparatus 36 is provided with the air pump 52 in an oxygen-containing gas supply channel 60, for sucking the air from the atmospheric air, and compressing the air to supply the compressed air as an oxygen-containing gas to the fuel cell stack 34.

The oxygen-containing gas supply channel 60 is provided with a humidifier (HUM) 62 and a bypass channel 66 for bypassing the humidifier 62 through a bypass valve 64.

The oxygen-containing gas supply channel 60 is connected to the oxygen-containing gas inlet connection port 58a of the fuel cell stack 34 through the humidifier 62 and an oxygen-containing gas supply channel 65.

An oxygen-containing exhaust gas discharge channel 68 is connected to the oxygen-containing gas outlet connection port 58b through an oxygen-containing exhaust gas discharge channel 67 and the humidifier 62. The EGR pump 54 is provided between the oxygen-containing exhaust gas discharge channel 68 and the oxygen-containing gas supply channel 60.

At the time of stopping power generation of the fuel cell vehicle 10 where the power switch 32 is placed in the OFF state, the EGR pump 54 circulates some of the oxygen-containing exhaust gas (cathode off gas) which is a gas discharged from the oxygen-containing gas outlet connection port 58b back to the oxygen-containing gas inlet connection port 58a.

The air pump 52 is provided with an inlet seal valve 70 on a side where the oxygen-containing gas supply channel 60 is present.

The oxygen-containing exhaust gas discharge channel 68 is provided with an outlet seal valve 72, and a diluter 76 is connected to the downstream side of the outlet seal valve 72 through a back pressure control valve 74.

The fuel gas supply apparatus 38 includes a high pressure hydrogen tank (accumulator) 80 for storing high pressure hydrogen, and the high pressure hydrogen tank 80 is connected to the fuel gas inlet connection port 56a of the fuel cell stack 34 through a fuel gas supply channel 82. The fuel gas supply channel 82 is provided with an interruption valve (not shown), a regulator valve 84 for regulating the pressure of the fuel gas, the injector 57, and an ejector 86 arranged in series from the side where the hydrogen tank 80 is provided, in the flow direction of the hydrogen gas. It should be noted that two or more injectors 57 may be provided in parallel.

A fuel exhaust gas channel 88 is connected to a fuel gas outlet connection port 56b of the fuel cell stack 34. The fuel exhaust gas channel 88 is connected to a gas liquid separator 90, and the gas liquid separator 90 is provided with a drain channel 92 for discharging the liquid component (liquid water) and a gas channel 94 for discharging the gas components including hydrogen and nitrogen.

The gas channel 94 is connected to the ejector 86 through a circulation channel 96, and connected to the diluter 76 under opening operation of a purge valve 98. The drain channel 92 is connected to the diluter 76 through a drain valve 100.

The diluter 76 has a function of mixing a fuel exhaust gas discharged from the fuel gas outlet connection port 56b of the fuel cell stack 34 (anode off gas containing the hydrogen gas), and an oxygen-containing exhaust gas discharged from the oxygen-containing gas outlet connection port 58b of the fuel cell stack 34 (cathode off gas containing the oxygen) to dilute the hydrogen concentration to not more than a predetermined value.

Pressure sensors 102a, 102b, 102c, 102d, and 102e are disposed in the oxygen-containing gas supply channel 65, the oxygen-containing exhaust gas discharge channel 67, the fuel gas supply channel 82, the fuel exhaust gas channel 88, and on the outlet side of the high pressure hydrogen tank 80, respectively. A hygrometer 103 is disposed in the oxygen-containing gas supply channel 65. Thermometers 104a, 104b are disposed in the oxygen-containing exhaust gas discharge channel 67 and the fuel exhaust gas channel 88, respectively.

In the embodiment, for ease of understanding, the gas pressure (fuel gas pressure, hydrogen pressure) measured by a pressure sensor 102c disposed on the inlet side of the fuel gas inlet connection port 56a is referred to as the gas pressure PH. Data of the gas pressure PH is sent to the control device 30.

The power generation voltage Vfc as the voltage applied between the terminals of the fuel cell stack 34 is measured by a voltmeter 25, the power generation current Ifc flowing from the fuel cell stack 34 is measured by an ammeter 26, and the stack temperature of the fuel cell stack 34 is measured by the thermometer 104a, and these items of data is sent to the control device 30. An electric circuit including the high voltage battery 14, the low voltage battery 16, the power converter 20, etc. is provided with a voltmeter, an ammeter, and a thermometer (not shown). Likewise, the measurement values are sent to the control device 30. The stack temperature may be measured using the thermometer 104b.

The control device 30 controls the oxygen-containing gas supply apparatus 36 (air pump 52, etc.) to control the supply of the oxygen-containing gas to the fuel cell 34, and controls the fuel gas supply apparatus 38 (interruption valve (not shown), a regulator valve 84, the injector 57, etc.) for controlling the supply of the fuel gas to the fuel cell 34.

[Normal Operation of the Fuel Cell Vehicle 10 During Travel, Etc.]

Figure 2:
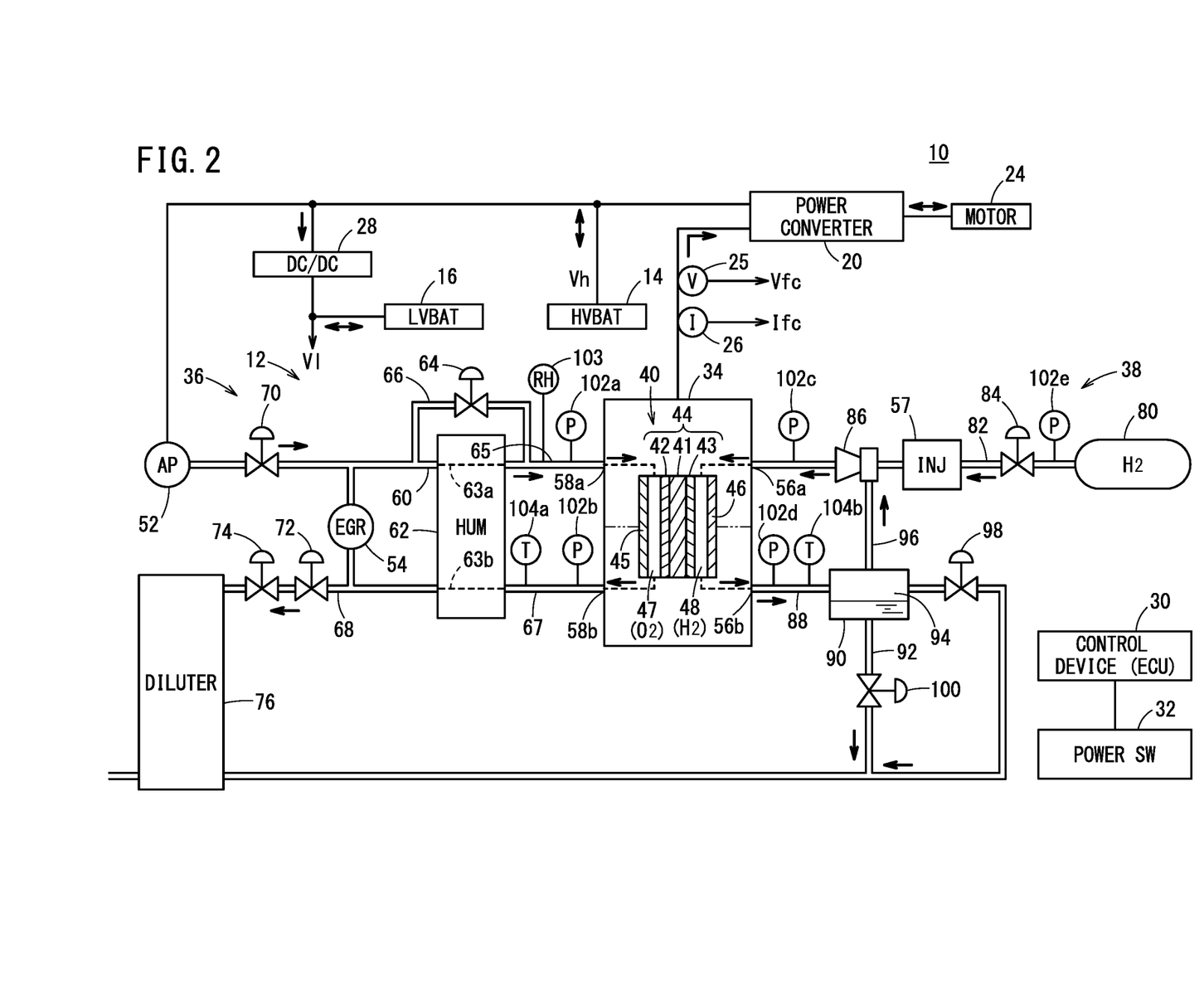
FIG. 2 is a block diagram with arrows used for illustrating power generation operation during normal travel of a fuel cell vehicle.

Normal operation during travel (power generation operation during normal travel such as travel in the city area, travel in the suburb area, and travel on the express way where acceleration/deceleration operation is performed) of the fuel cell vehicle 10 equipped with the fuel cell system 12 basically having the above structure will be described with reference to FIG. 2 which is created from the block diagram in FIG. 1 by including arrows indicating the flows of the fuel gas, the oxygen-containing gas, and electrical energy.

During normal operation where the power switch 32 is in the ON state, the oxygen-containing gas (air) is supplied from the air pump 52 operated using electrical energy at high voltage Vh to the oxygen-containing gas supply channel 60. After the oxygen-containing gas flows through the humidifier 62 or after the oxygen-containing gas flows through the bypass channel 66, and bypasses the humidifier 62, the oxygen-containing gas is supplied to the oxygen-containing gas inlet connection port 58a of the fuel cell stack 34.

It should be noted that the humidifier 62 includes a channel 63a as a passage of the oxygen-containing gas (dried air), and a channel 63b as a passage of the exhaust gas (humidified oxygen-containing exhaust gas, cathode off gas) from the oxygen-containing gas outlet connection port 58b of the fuel cell stack 34 flowing through the oxygen-containing gas outlet connection port 58b of the fuel cell stack 34 and the oxygen-containing exhaust gas discharge channel 67, and the humidifier 62 has a function of humidifying the oxygen-containing gas supplied from the air pump 52. That is, the humidifier 62 moves water component contained in the cathode off gas to the supply gas (oxygen-containing gas) through a porous membrane.

The humidification at this time is set to a humidification amount in such a degree where solid polymer electrolyte membrane 41 is humidified, and the power generation performance is suitably exerted in the fuel cell stack 34. Determination of the humidification amount is performed by controlling the opening degree of the bypass valve 64 by the control device 30 with reference to the hygrometer 103.

On the other hand, in the fuel gas supply apparatus 38, the fuel gas from the hydrogen tank 80 where the gas pressure is controlled by the regulator valve 84 under the control of the control device 30 is discharged into the fuel gas supply channel 82 under the open/close control of the injector 57 by the control device 30. The fuel gas is mixed with the fuel exhaust gas sucked into the ejector 86 through the circulation channel 96, and discharged from the ejector 86. Then, the fuel gas is supplied to the fuel gas inlet connection port 56a of the fuel cell stack 34. It should be noted that, in addition to the ejector 86 for circulating the fuel exhaust gas, a circulation pump, so called a hydrogen circulation pump may be provided in the circulation channel 96.

In the fuel cell stack 34, the oxygen-containing gas is supplied from the oxygen-containing gas inlet connection port 58a to the cathode 42 through the cathode flow field 47 of each of the power generation cells 40. In the meanwhile, the hydrogen gas is supplied from the fuel gas inlet connection port 56a to the anode 43 through the anode flow field 48 of each of the power generation cells 40. Therefore, in each of the power generation cells 40, the air supplied to the cathode 42 and the hydrogen gas supplied to the anode 43 are partially consumed in electrochemical reactions in the electrode catalyst layers to perform power generation.

Then, the oxygen-containing exhaust gas which is the air supplied to, and partially consumed at the cathode 42, and the water produced in the reaction are discharged into the oxygen-containing gas outlet connection port 58b, and flow through the oxygen-containing exhaust gas discharge channel 68 into the diluter 76. Likewise, the hydrogen gas supplied to, and partially consumed at the anode 43 is discharged as the fuel exhaust gas (after some of the fuel gas has been consumed) into the fuel gas outlet connection port 56b. After the fuel exhaust gas flows from the fuel exhaust gas channel 88 into the gas liquid separator 90 to remove the liquid component (liquid water), the fuel exhaust gas is sucked from the gas channel 94 into the ejector 86 through the circulation channel 96.

The electric energy of the power generation voltage Vfc at high voltage generated in power generation of the fuel cell stack 34 formed by connecting a plurality of power generation cells 40 electrically together in series is converted into the electric energy of the higher voltage (drive voltage) in the power converter 20 under the control of the control device 30 so as to obtain the required drive torque of the motor 24, and supplied to the motor 24.

It should be noted that the power converter 20 has an inverter (not shown), and the duty of the inverter is controlled based on the opening degree of an accelerator pedal (not shown) (accelerator pedal opening degree) through the control device 30 to drive the motor 24 by three-phase PWM driving. As a result, the fuel cell vehicle 10 travels.

In the case where there is extra electrical energy of the power generation voltage Vfc generated in power generation of the fuel cell stack 34, under the control of the control device 30, the extra electric energy is charged in the high voltage battery 14 at the high voltage Vh through the power converter 20, and the electrical energy of high voltage Vh is converted into electrical energy of low voltage Vl through the step-down converter 28, and then, charged in the low voltage battery 16.

The electrical energy of the high voltage battery 14 at high voltage Vh is supplied to the motor 24, and additionally, supplied to high voltage loads such as the air pump 52, and an air conditioner (not shown), etc.

The electric energy of the low voltage battery 16 at low voltage Vl is supplied to low voltage loads such as the control device 30, and the injector 57, etc.

Each of the SOCs of the high voltage battery 14 and the low voltage battery 16 (state of charge: the SOC indicates the amount of charged electrical energy where 100[%] indicates the "full charge state") is calculated by the control device 30 based on the voltage detected by the voltmeter, the electric current detected by the ammeter, and the temperature detected by the thermometer, with reference to a map (not shown).

[Operation of Detecting Degradation of the Membrane Electrode Assembly 44 in the Fuel Cell System 12 of the Fuel Cell Vehicle 10]

Figure 3:
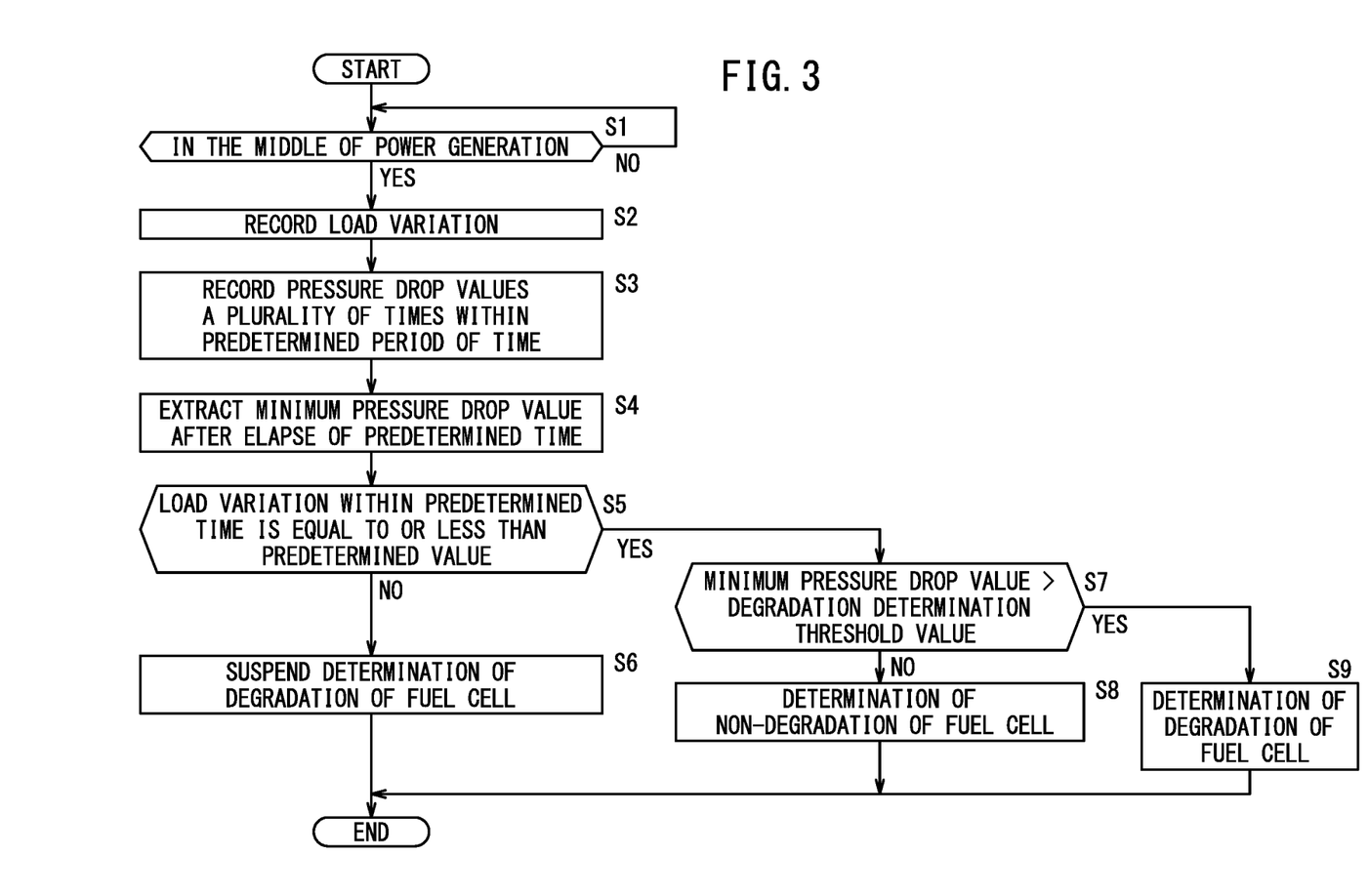
FIG. 3 is a flow chart used for illustrating a method of detecting degradation of the membrane electrode assembly in the fuel cell system according to the embodiment.
Figure 4A:
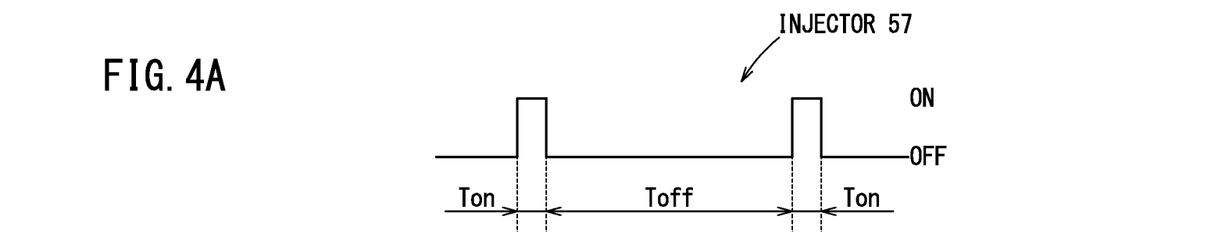
FIGS. 4A and 4B are timing charts used for illustrating the method of detecting degradation of the membrane electrode assembly in the fuel cell system according to the embodiment.

Normal operation of the fuel cell system 12 during the travel, etc. has been described above. Next, a method of detecting degradation of the membrane electrode assembly in the fuel cell system according to main part of the present invention will be described in relation to the fuel cell vehicle 10 equipped with the fuel cell system 12 which performs this method, with reference to a flow chart of FIG. 3 and timing charts of FIGS. 4A and 4B showing the processes performed by the control device 30.

In step S1, the control device 30 determines whether or not the power switch 32 is in the ON state, and the fuel cell stack 34 is in the middle of performing power generation. When the fuel cell stack 34 is in the middle of performing power generation (step S1: YES), in step S2, recording of load variation (load variation range) Ipp is started.

Figure 5A:
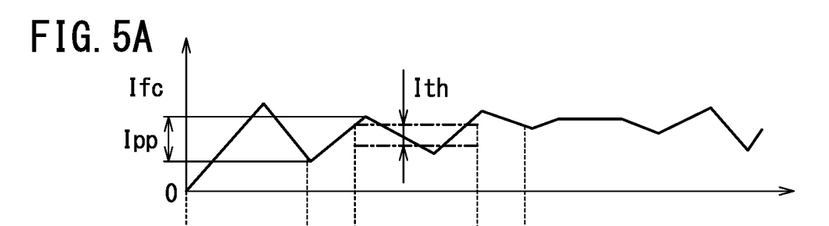
FIG. 5A is a graph showing characteristics of power generation current in the case where load variation is large.

As shown in FIG. 5A, the load variation Ipp is calculated by the control device 30, as a difference between a top peak value and a bottom peak value of the power generation current Ifc measured continuously by the ammeter 26 in a recording target period. For example, at the time of acceleration or at the time of deceleration of the fuel cell vehicle 10, in comparison with the time of constant velocity traveling, the load variation Ipp becomes large.

Figure 4B:
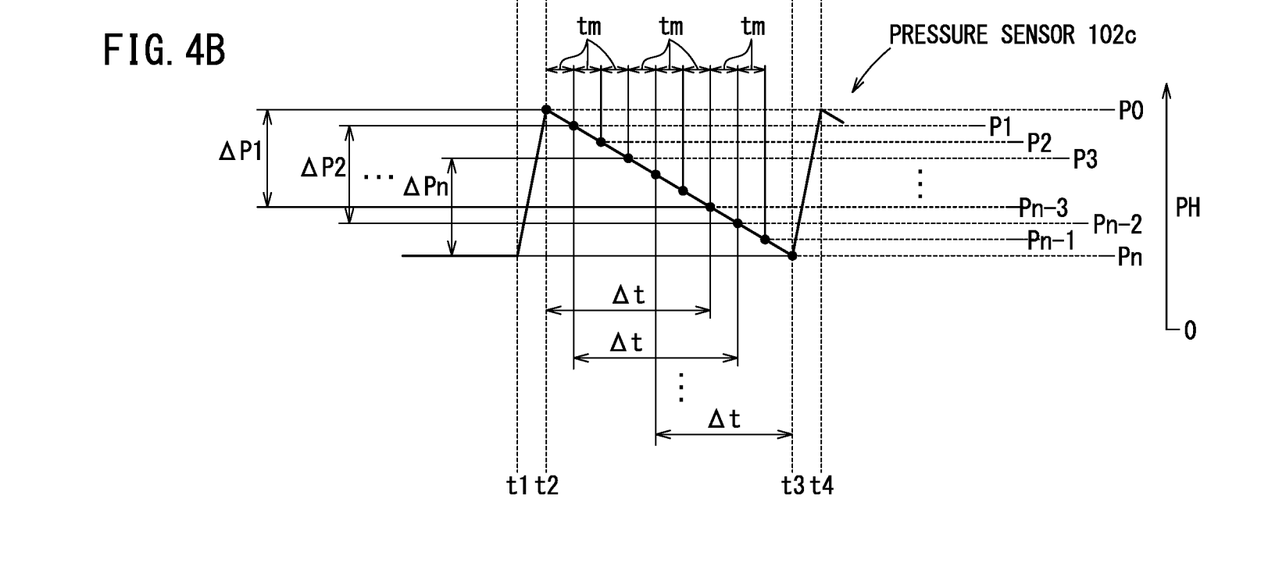

Then, in step S3, as shown in FIG. 4B, the pressure drop value (or an amount of drop in pressure) ΔPH (ΔP1, ΔP2, . . . ΔPn) is measured a plurality of times within the predetermined period of time Toff, and recorded.

As shown in FIG. 4A, the control device 30 intermittently places the injector 57 in the ON state (the time point t1 to the time point t2=Ton: ON, the time point t2 to the time point t3=Toff: OFF, the time point t3 to the time point t4=Ton: ON), and discharges a predetermined amount of the fuel gas during each of the ON segments Ton, and supplies the fuel gas to the fuel gas supply connection port 56a through the ejector 86.

Then, the predetermined period of time Toff as the OFF segment (the time point t2 to the time point t3) after gas discharging is divided into minute times tm as shown in FIG. 4B, and the pressure drop value ΔPH of the predetermined period of time (measurement time) Δt (Δt<Toff) made up of a predetermined number of minute times tm is measured a plurality of times with a shift of the minute time tm each time. The predetermined period of time Toff is a period in the order of ms (millisecond). Further, the predetermined period of time Toff corresponds to a recording target period of the above described load variation Ipp.

In step S3, the pressure drop values recorded a plurality of times (plurality of pressure measurement values) ΔPH are calculated as $\Delta PH = \Delta P1 \{\Delta P1 = P0 - (Pn-3)\}$, $\Delta P2 \{\Delta P2 = P1 - (Pn-2)\}$, ... $\Delta Pn (\Delta Pn = P3 - Pn)$.

Then, in step S4, from the time point t3 after the elapse of the predetermined period of time Toff, among the plurality of recorded pressure drop values $\Delta PH$, the minimum pressure drop value $\Delta PHmin$ is extracted.

Then, in step S5, it is determined whether or not load variation Ipp within the predetermined period of time Toff is not more than a predetermined load variation threshold value Ith (Ipp≤Ith).

Figure 5B:
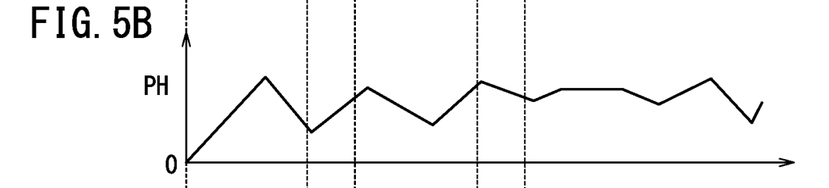
FIG. 5B is a graph showing characteristics of the gas pressure of a fuel gas in the case where load variation is large.

For example, as shown in FIG. 5A, in the case where the load variation Ipp within the predetermined period of time Toff measured as variation of the power generation current Ifc exceeds the load variation threshold value Ith (step S5: NO), as shown in FIG. 5B, since the pressure variation of the gas pressure PH of the fuel gas becomes large in accordance with the load variation Ipp, the detection accuracy of detecting degradation based on the pressure drop value $\Delta PH$ is degraded significantly, and thus, it becomes difficult to discern the difference from the case where the gas pressure is decreased due to degradation of the membrane electrode assembly 44 (cross leakage).

In this case, in step S6, determination of degradation of the membrane electrode assembly 44 of the fuel cell stack 34 is suspended, and the process is finished.

Figure 5C:
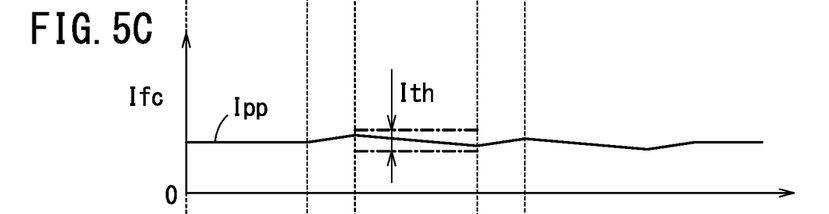
FIG. 5C is a graph showing characteristics of power generation current in the case where load variation is small.
Figure 5D:
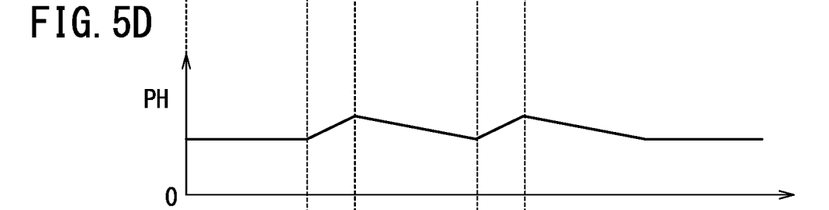
FIG. 5D is a graph showing characteristics of the gas pressure of a fuel gas in the case where load variation is small.
Figure 5E:
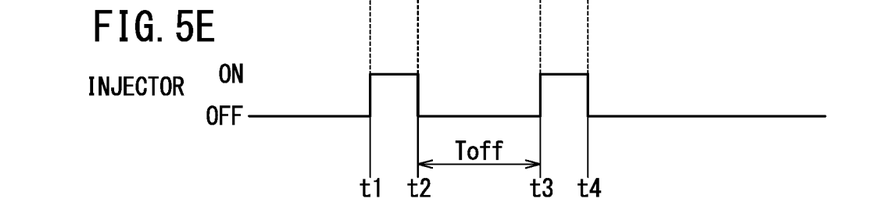
FIG. 5E is a graph illustrating a waveform of intermittent discharge the fuel gas by an injector.

In contrast, in determination of step S5, for example, as shown in FIG. 5C, in the case where load variation Ipp within the predetermined period of time Toff is not more than the predetermined load variation threshold value Ith (Ipp Ith) (step S5: YES), i.e., in the case where load variation Ipp is small, since the influence of consumption of the fuel gas by power generation and other error factors is small, it is possible to accurately detect degradation due to the relatively small pressure drop value $\Delta PH$ caused by the cross leakage. It should be noted that the waveforms of FIGS. 5D and 5E correspond to the waveforms of FIGS. 4B and 4A, respectively.

It should be noted that, in the case where the fuel cell vehicle 10 is stopped, and the fuel cell stack 34 is so called in the idle power generation state, since the load variation Ipp is small, degradation can be detected accurately.

In this case, in step S7, it is determined whether or not the minimum pressure drop value $\Delta PHmin$ extracted in step S4 exceeds a predetermined degradation determination threshold value $\Delta PHth$.

In the case where the condition of the determination in step S7 is not satisfied (step S7: NO), i.e., in the case where the minimum pressure drop value $\Delta PHmin$ is not more than the degradation determination threshold value $\Delta PHth$, it is determined that no cross leakage has occurred in the membrane electrode assembly 44 due to generation of pin holes, etc. as a result of degradation of the membrane, and in step S8, the state where the membrane electrode assembly 44 in the fuel cell system 12 is not degraded, is recorded (logged).

On the other hand, in the case where the condition of the determination in step S7 is satisfied (step S7: YES), i.e., in the case where the minimum pressure drop value $\Delta PHmin$ exceeds the degradation determination threshold value $\Delta PHth$, it is determined that the minimum pressure drop value $\Delta PHmin$ includes the pressure drop value due to cross leakage, and in step S9, the state where the membrane electrode assembly 44 in the fuel cell system 12 is degraded, is recorded (logged).

In this case, the state where the membrane electrode assembly 44 is degraded is displayed on the meter panel, and the state where the membrane electrode assembly 44 is degraded is notified to a dealer, etc. through communication.

The above embodiment may be modified in the manner as described below.

Modified Embodiment

In step S4, instead of extracting the minimum drop value $\Delta PHmin$, the average pressure drop value $\Delta PHmean$ based on moving average may be calculated $\{(\Delta PHmean = (\Delta P1 + \Delta P2 \ldots + \Delta Pn)/n\}$, and in step S7, it may be determined whether or not this average pressure drop value $\Delta PHmean$ exceeds the degradation determination threshold value $\Delta PHth$.

In this manner, since the average value is calculated by performing measurement a plurality of times, it is possible to reduce the influence of coincidental errors on the measurement value.

Invention that can be Understood from the Embodiment and the Modified Embodiment Hereinafter, the invention understood from the above embodiment and the modified embodiment will be described below. For ease of understanding, the constituent elements are labelled with the reference numbers used in the embodiment. However, the constituent elements are not limited to those labelled with the reference numerals.

In the method of detecting degradation of the membrane electrode assembly 44 of the fuel cell 34 according to the present invention, a plurality of the cells 40 are stacked together to form the fuel cell 34, and the fuel cell 34 is configured to perform power generation using a fuel gas discharged from the fuel tank 80 through the injector 57 and the ejector 86 and supplied from the fuel gas inlet 56a to the anode 43 of the membrane electrode assembly 44 of the cell 40, a fuel exhaust gas from the fuel gas outlet 56b mixed with the fuel gas, and supplied to the fuel gas inlet 56a, and an oxygen-containing gas supplied from the oxygen-containing gas inlet 58a to the cathode 42 of the membrane electrode assembly 44. The method includes the discharging a predetermined amount of the fuel gas from the injector 57, measuring, a plurality of times, a pressure drop value $\Delta PH$ of the pressure of the fuel gas which decreases in the power generation state after discharging of the predetermined amount of the fuel gas in each predetermined period of time $\Delta t$, by the pressure sensor 102c provided downstream of the injector 57, between the fuel gas outlet 56b and the fuel gas inlet 56a, and determining that the membrane electrode assembly 44 has been degraded in the case where the minimum pressure drop value $\Delta PHmin$, among a plurality of pressure measurement values, exceeds a threshold value $\Delta PHth$.

In this case, in the measurement, after measuring, a plurality of times, a pressure drop value $\Delta PH$ of the pressure of the fuel gas which decreases in the power generation state after discharging of the fuel gas in each predetermined period of time $\Delta t$, in the determination, it is determined that the membrane electrode assembly 44 has been degraded in the case where the minimum pressure drop value $\Delta PHmin$, among a plurality of pressure measurement values, exceeds a threshold value $\Delta PHth$. In this manner, it is possible to detect degradation (cross leakage) of the fuel cell 34 easily, in a short period of time, and accurately without providing any additional member for measurement.

In this case, in the measurement, the pressure drop value $\Delta PH$ of the fuel gas may be measured in each predetermined period of time with a time shift between a time of discharging the fuel gas from the injector 57 and the next time of discharging the fuel gas from the injector 57.

In this manner, since the pressure drop value ΔPH is measured a plurality of times within the predetermined period of time, it is possible to increase the possibility of improving the reliability of the degradation detection determination results.

In this regard, preferably, the method of detecting degradation of the membrane electrode assembly is implemented within a period in which load variation of the fuel cell falls within a range of load variation threshold value.

By detecting degradation of the membrane electrode assembly 44 during the period within the range of the load variation threshold value, it is possible to prevent degradation of the detection accuracy.

Further, preferably, the ejector 86 is provided in series between the injector 57 and the fuel gas inlet 56a, and the ejector 86 is configured to discharge to the fuel gas inlet 56a the fuel gas supplied from the injector 57, and the fuel exhaust gas sucked and mixed to the fuel gas, the injector 57 supplies the predetermined amount of the fuel gas, and the pressure sensor 102c is provided between a discharge port of the ejector 86 and the fuel gas inlet 56a.

Since there is no need to use the hydrogen circulation pump, it is possible to detect degradation of the membrane electrode assembly 44 at low cost.

In the method of detecting degradation of the membrane electrode assembly 44 of the fuel cell 34 according to the present invention, a plurality of the cells 40 are stacked together to form the fuel cell 34, and the fuel cell 34 is configured to perform power generation using a fuel gas discharged from the fuel tank 80 through the injector 57 supplied from the fuel gas inlet 56a to the anode 43 of a membrane electrode assembly 44 of the cell 40, a fuel exhaust gas from the fuel gas outlet 56b mixed with the fuel gas, and supplied to the fuel gas inlet 56a, and an oxygen-containing gas supplied from the oxygen-containing gas inlet 58a to the cathode 42 of the membrane electrode assembly 44. The method includes the discharging a predetermined amount of the fuel gas from the injector 57, measuring, a plurality of times, a pressure drop value ΔPH of the pressure of the fuel gas which decreases in the power generation state after discharging of the fuel gas in each predetermined period of time Δt, by the pressure sensor 102c provided downstream of the injector 57, between the fuel gas outlet 56b and the fuel gas inlet 56a, and calculating the average pressure drop value ΔPHmean of the pressure drop value ΔPH which was measured a plurality of times, and determining that the membrane electrode assembly 44 has been degraded in the case where the average pressure drop value ΔPHmean exceeds a threshold value ΔPHth.

In the present invention, a pressure drop value ΔPH of the pressure of the fuel gas which decreases in the power generation state after discharging of the fuel gas in each predetermined period of time Δt is measured a plurality of times. Thereafter, the average pressure drop value ΔPHmean is calculated, and in the case where the average pressure drop value ΔPHmean exceeds the threshold value ΔPHth, it is determined that the membrane electrode assembly 44 has been degraded. In this manner, it is possible to reduce coincidental errors, and detect degradation (cross leakage) of the fuel cell easily, in a short period of time, and accurately without providing any additional member for measurement.

The present invention is not limited to the above described embodiments. It is a matter of course that various structures can be adopted based on the description of this specification.

What is claimed is:

1. A method of detecting degradation of a membrane electrode assembly of a fuel cell, the fuel cell being configured to perform power generation using a fuel gas discharged through an injector and supplied from a fuel gas inlet to an anode of a membrane electrode assembly of a cell, a fuel exhaust gas from a fuel gas outlet mixed with the fuel gas, and supplied to the fuel gas inlet, and an oxygen-containing gas supplied from an oxygen-containing gas inlet to a cathode of the membrane electrode assembly, the method comprising:
discharging a predetermined amount of the fuel gas from the injector;
measuring, a plurality of times, a pressure drop value of the pressure of the fuel gas which decreases after discharging of the fuel gas, in each predetermined period of time, by a pressure sensor provided downstream of the injector, between the fuel gas outlet and the fuel gas inlet; and
determining that the membrane electrode assembly has been degraded in a case where the minimum pressure drop value, among a plurality of pressure measurement values, exceeds a threshold value.

2. The method of detecting degradation of the membrane electrode assembly of the fuel cell according to claim 1, wherein in the measuring, the pressure drop value of the fuel gas is measured in each predetermined period of time with a time shift between a time of discharging the fuel gas from the injector and a next time of discharging the fuel gas from the injector.

3. The method of detecting degradation of the membrane electrode assembly of the fuel cell according to claim 1, wherein the method of detecting degradation of the membrane electrode assembly is implemented within a period in which load variation of the fuel cell falls within a range of load variation threshold value.

4. The method of detecting degradation of the membrane electrode assembly of the fuel cell according to claim 1, wherein an ejector is provided in series between the injector and the fuel gas inlet;
the ejector is configured to discharge to the fuel gas inlet the fuel gas supplied from the injector and the fuel exhaust gas sucked and mixed to the fuel gas, the injector supplies the predetermined amount of the fuel gas, and the pressure sensor is provided between a discharge port of the ejector and the fuel gas inlet.

* * * * *